United States Patent [19]

Polk, Jr.

[11] 4,177,431

[45] Dec. 4, 1979

[54] LOUDSPEAKER-CABLE INTERFACE

[76] Inventor: Matthew S. Polk, Jr., 34 E. Melrose Ave., Baltimore, Md. 21212

[21] Appl. No.: 887,740

[22] Filed: Mar. 17, 1978

[51] Int. Cl.$^2$ .......... H03F 1/26

[52] U.S. Cl. .......... 330/149; 179/1 P

[58] Field of Search .......... 330/149; 179/1 D, 1 P

[56] References Cited

U.S. PATENT DOCUMENTS

| | | | |
|---|---|---|---|
| 2,802,054 | 8/1957 | Corney | 179/1 D |
| 3,851,269 | 11/1974 | Szorc | 330/149 X |

OTHER PUBLICATIONS

Rendle, "Build Your Own Electrostatic Loudspeaker", *Electronics Australia*, vol. 37, No. 12, pp. 82–83, 85, 87, Mar. 1976.

*Primary Examiner*—James B. Mullins
*Attorney, Agent, or Firm*—Cushman, Darby & Cushman

[57] ABSTRACT

A loudspeaker-cable interface for use in audio reproduction systems including a capacitor and resistor for effectively terminating the cable with a predetermined impedance at frequencies above the audio range. The interface operates to inhibit generation of spurious high-frequency oscillations which could cause damage to the amplifier.

9 Claims, 1 Drawing Figure

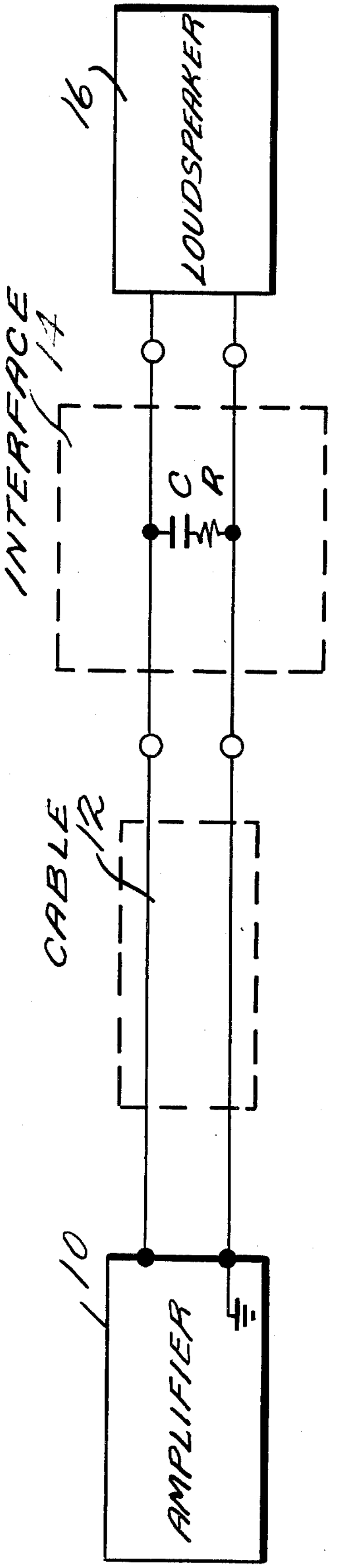
16
LOUDSPEAKER
INTERFACE
14
C
R
CABLE
12
10
AMPLIFIER

LOUDSPEAKER-CABLE INTERFACE

The present invention is related to audio reproduction systems, and more particularly to means for electrically connecting an amplifier to a loudspeaker in such a system.

As more sophistocated high fidelity audio reproduction systems have become popular, a need has developed for improved speaker cables for transmitting audio frequency signals from the amplifier to the loudspeaker. In such high fidelity systems which utilize a standard cable comprising two parallel wires, distortion due to, for example, self-inductance high reactance and minimized charge bearing surface becomes significant. The self-inductance phenomenon in standard parallel construction cable is the product of interacting magnetic fields, and is manifested by signals in one wire inducing an undesirable signal of opposite polarity in the other wire. Such spurious signals are applied to the amplifier, causing amplifier distortion and general degradation of the audio signal. Further, the self-inductance of the cable, in effect, limits the bandwidth of the cable, in that phase shift due to the self-inductance tends to interfer with transmission of high frequencies.

Further, proper impedance matching between the loudspeaker and cable tends to be difficult to obtain with standard parallel wire cable. The characteristic impedance of a typical standard parallel wire cable is on the order of 100Ω, whereas a loudspeaker typically manifests an impedance of from 4 to 16Ω over the audio frequency range. Such cable-loudspeaker impedance mismatching causes inefficient transfer of energy, and reflection of a portion of the audio signal back to the amplifier from the loudspeaker. Such reflections often result in false reverberance, further instability and distortion in the amplifier, or both.

To alleviate these problems a number of what may be termed "super speaker cables" have been developed. In general, such super speaker cables utilize a large plurality (up to 200) of separately insulated small conductors arranged in two sets which are relatively disposed (such as by braiding or reverse twisting) to minimize self-inductance and mutual inductance. The cables exhibit a very low DC resistance, and a high capacitance to maintain a low characteristic impedance. The minimized self-inductance of the cable operates to extend the bandwidth of the cable (up to as high as 500 kHz), and resistive losses and radiation losses are minimized. In addition, the characteristic impedance of the super speaker cables (for example, 9Ω) are compatible with the impedance of the speaker over the audio frequency range. Thus, proper impedance matching can be readily attained to minimize the portion of the audio frequency signal reflected from the load (speaker). Additionally, the super speaker cable provides a constant damping factor across and above the audio frequency range.

It has been observed, however, that unstable conditions result when such super speaker cables are utilized in various audio reproduction systems. More particularly, in some systems, the amplifier enters a state of uncontrolled oscillation. The occurence of such unstable conditions, has been observed to be rather arbitrary. The oscillation has been found to occur in some instances at unnoticeably low signal levels, and in other instances to occur at such levels as to physically damage the amplifier. Further, the oscillation has been observed to cause appreciable distortion in one channel of a stereo system with supposedly identical channels but with no appreciable effect in the other channel, and has been observed to occur in a system utilizing a given amplifier and super speaker cable with some speakers and not occur when other speakers are used.

The present invention provides for eliminating such spurious oscillations without denigrating the performance of the super speaker cable. In accordance with one aspect of the invention, it is noted that such oscillations occur only when the super speaker cable (of low characteristic impedance) is poorly terminated at high frequencies. More particularly, it is noted that the effect of the inductive portion of the loudspeaker impedance becomes appreciable at frequencies above the audio frequency band, causing reflections of these high frequencies back to the amplifier signals. The high frequency oscillations are eliminated by providing an interface between the cable and speaker for terminating the cable with an appropriate impedance at such high frequencies. As will be explained, the interface preferably comprises a capacitor and resistor connected in series across the cable proximate to the speaker.

A preferred exemplary embodiment of the present invention will now be described with reference to the accompanying drawing, wherein the sole FIGURE is a schematic block diagram of a system in accordance with the present invention.

With reference now to the drawing, there is shown an amplifier 10 having connected to the output terminals thereof, a super speaker cable 12. It should be appreciated that super speaker cable 12 is shown in schematic form, and actually comprises two sets of plural individual low resistance conductors disposed to minimize self-inductance and to provide a low characteristic impedance for the cable. The other end of cable 12 is connected to the input terminals of an interface 14, the output terminals thereof being connected to loudspeaker 16.

The frequency of the spurious oscillation has been observed to be above the audio frequency range (super audio), typically on the order of 1 MHz. The particular frequency of oscillation appears to depend on the particular amplifier and the length and particular type of super speaker cable used. It was empirically found when lengths ranging from 12 ft. to 50 ft. of a super speaker cable having an inductance of 0.037 μH, a capacitance of 500 pF/foot and a resistance of 0/0037 Ω/ft. were connected to a "Phase Linear 400-type amplifier and terminated with a 3.1 μH choke having a DC resistance of 0.015 Ω", the frequency of oscillation ranged from 1.85 MH at 12 feet, to 1.25 MH at 50 feet. Similar oscillation frequencies were observed with actual loudspeaker loads, having an inductive component.

It was discovered that spurious high frequency oscillation occurred only when a low characteristic impedance super speaker cable was coupled to a load having a large inductive component.

The impedance of loudspeakers at frequencies above the audio frequency range has never before been considered important. However, in accordance with the present invention, it appears necessary to properly terminate the transmission line even at super audio frequencies in the MHz range.

Where the termination of the cable has an appreciable inductive component, the load impedance rises constantly with increasing frequency. For example, for a typical tweeter voice coil having an inductance of 0.015 μH and a DC resistance of 6Ω, the impedance and phase angle for super audio frequencies ranging from 200 KHz to 1 MHz are set out in Table I.

TABLE I

| fHz | ZΩ | θ° |
|---|---|---|
| 20 K | 19.8 | 72 |
| 50 K | 47.5 | 84 |
| 100 K | 94.4 | 86 |
| 200 K | 188.6 | 88 |
| 500 K | 471 | 89 |
| 1 MHz | 942 | 89.6 |

The present inventor theorizes that the constantly increasing impedance at high frequencies due to the inductive component of the load presents a poor termination at high frequencies for the low impedance cable. That is, at high frequencies the cable presents a capacitive load to the amplifier. Accordingly, rather than transferring energy to the load (speaker unit), increasing amounts of high frequency signals are reflected back to the amplifier thus, what are, in effect, standing waves are formed in the cable itself.

The possibility of deleterious oscillations in the amplifier results from the reflected signals (standing waves) in the cable as follows. The reflected signals cause the amplifier to "see" the high capacitance of the cable, resulting in an additional phase shift at the oscillator output terminals. At the high frequency range, considerable phase shifts tend to exist in the amplifier output and feedback loops even in normal operation. Accordingly, the additional phase shift due to the reflections tend to cause the amplifier to go into oscillation. It appears that the oscillation is apparently initiated by either high order harmonic distortion or clipping.

This theory is born out by the fact that such spurious oscillations are not manifested in transformer coupled amplifiers, such as tube-type amplifiers, or where the output terminals are otherwise inductively isolated (as by the high self-inductance of standard parallel wire-type cable). Further, it appears that the oscillation occurs only in amplifiers which are not bandwidth limited. In any event, irrespective of the physics of the phenomenon of the generation of the spurious high frequency oscillations, the use of an interface in accordance with the present invention has been found experimentally to eliminate oscillations even in systems prone to violent instability.

Accordingly, interface 14 is interposed between loudspeaker 16 and cable 12. Interface 14 operates to provide a proper termination for the cable at high frequencies to eliminate the spurious high frequency oscillation. A resistor of a value on the order of the characteristic impedance of the cable coupled across the cable can be utilized as the interface, and to suppress the high frequency oscillations. However, such a termination would also dissipate power in the audio range and reduce the effective power to the loudspeaker. Accordingly, interface 14 suitably comprises a capacitor and resistor connected in series between the sets of individual conductors of the cable. The capacitor is chosen to be of a value such that the load impedance is decreased with increasing frequency and is low at the higher frequencies, and the resistor is chosen to be of a value on the order of the characteristic impedance of the cable. Such a combination will ensure that the net impedance of the load will never be high enough to promote oscillation. For example, the impedance and phase angle, over a range of super audio frequencies from 20 K to 1 MHz of an interface having a resistance of 6.2Ω and a capacitance of 0.05 μF is shown in Table II.

TABLE II

| fHz | ZΩ | θ° |
|---|---|---|
| 20 KHz | 159 | 88.0 |
| 50 KHz | 64 | 84.5 |
| 100 KHz | 32.5 | 79.0 |
| 200 KHz | 17.1 | 69.0 |
| 500 KHz | 8.9 | 46.0 |
| 1 MHz | 7.0 | 27.0 |

An interface 14 having the characteristics shown in Table II will efficiently absorb any super audio frequency power when used in conjunction with cables having characteristic impedances on the order of 8Ω to 16Ω.

Interface 14 can be made integral to a cable connector or it can be a separate unit adapted to receive the connectors from a separate super speaker cable and including connectors for connection to loudspeaker 16. Similarly, interface 12 can be incorporated into loudspeaker 16.

It will be understood that the above described is of illustrative embodiments of the present invention, and that the invention is not limited to the specific form shown. Modifications may be made in the design and the arrangement of the elements without departing from the spirit of the invention as expressed in the appended claims.

What is claimed is:

1. In an audio reproduction system of the type including an amplifier, at least one remote speaker unit, and a cable of predetermined characteristic impedance electrically connecting said remote speaker unit to said amplifier, said system having a tendency to generate spurious higher than audio frequency signals and a tendency to reflect said signals within the cable, said reflected signals passing through said cable to said amplifier, the improvement wherein said system further comprises:

interface means, interposed at the end of said cable between said cable and said speaker, for terminating said cable with a predetermined impedance at said higher than audio frequencies to inhibit generation of said spurious higher than audio frequency reflected signals, said predetermined impedance including a resistive component on the order of said characteristic impedance and a capacitive component of low value at said higher than audio frequencies.

2. The system of claim 1 wherein said interface means comprises:

first and second input terminals, adapted for electrical connection to said cable, first and second output terminals, adapted for electrical connection to said speaker; and means, cooperating with and interconnecting said input and output terminals, for effectively terminating said cable with a predetermined impedance at higher than audio frequencies to inhibit reflection of spurious signals at said higher than audio frequencies.

3. The system of claim 2 wherein said means for effectively terminating said cable comprises a capacitance and resistance coupled in series across said first and second input terminals, said first and second output terminals being connected to said first and second input terminals, respectively, said resistance being approximately equal to said characteristic impedance and said capacitance being of a value to manifest a low impedance at said high frequencies.

4. A speaker-cable interface for use in an audio reproduction system of the type including an amplifier, a remote speaker unit and cable of predetermined characteristic impedance for electrically connecting said remote speaker unit to said amplifier, said speaker-cable interface comprising:

first and second input terminals, adapted for electrical connection to said cable;

first and second output terminals, adapted for electrical connection to said cable;

means, cooperating with an interconnecting said input and output terminals, for effectively terminating said cable in close proximity to said remote speaker unit with a predetermined impedance at higher than audio frequencies to inhibit generation of spurious oscillations at said higher than audio frequencies, said predetermined impedance including a resistive component on the order of said characteristic impedance and a capacitive component of low value at said higher than audio frequencies.

5. The interface of claim 4 wherein said means for effectively terminating said cable comprises a capacitance and a resistance coupled in series across said first and second output terminals, said first and second terminals being connected to said first and second input terminals, respectively, said resistance being approximately equal to said characteristic impedance and said capacitance being of a value to manifest a low impedance at higher than audio frequencies.

6. In an audio reproduction system of the type including an amplifier and at least one remote speaker unit, means for electrically connecting said remote speaker unit to said amplifier comprising:

a cable including first and second sets of individual insulated conductors, said sets of conductors being relatively disposed to minimize self-inductance and reactance, said cable manifesting a predetermined characteristic impedance;

one end of said cable being adapted for electrical connection to said amplifier and the other end of said cable being adapted for electrical connection to said speaker; and means, coupled between said first sets of conductors and said second set of conductors at said cable other end, for effectively terminating said cable in close proximity to said remote speaker unit with a predetermined impedance at high frequencies to inhibit generation of spurious high frequency oscillations in said cable, said predetermined impedance including a resistive component on the order of said characteristic impedance and a capacitive component of low value at said higher than audio frequencies.

7. The means for electrically connecting of claim 6 wherein said means for effectively terminating said cable comprises:

a resistance and a capacitance coupled in series between said first set of conductors at said cable other end and said second set of conductors;

said resistance being of a value approximately equal to said predetermined characteristic impedance, and said capacitance being of a value so as to manifest a low impedance at said high frequencies.

8. The means for electrically connecting of claim 7 wherein said resistance is less than said predetermined characteristic impedance.

9. The means for electrically connecting of claims 7 or 9 wherein said capacitance is approximately equal to 0.05 $\mu$F.

* * * * *